United States Patent
Hirobe et al.

(10) Patent No.: US 8,422,188 B2
(45) Date of Patent: Apr. 16, 2013

(54) ESD PROTECTION DEVICE

(75) Inventors: Yasuhiro Hirobe, Tokyo (JP); Kensaku Asakura, Tokyo (JP); Atsushi Hitomi, Tokyo (JP); Takeshi Urano, Tokyo (JP)

(73) Assignee: TDK Corporation, Tokyo (JP)

( * ) Notice: Subject to any disclaimer, the term of this patent is extended or adjusted under 35 U.S.C. 154(b) by 493 days.

(21) Appl. No.: 12/458,765

(22) Filed: Jul. 22, 2009

(65) Prior Publication Data

US 2010/0020454 A1  Jan. 28, 2010

(30) Foreign Application Priority Data

Jul. 24, 2008 (JP) ............... 2008-190781
Dec. 16, 2008 (JP) ............... 2008-320098
Jun. 16, 2009 (JP) ............... 2009-143018

(51) Int. Cl.
*H02H 1/04* (2006.01)
*H02H 3/22* (2006.01)

(52) U.S. Cl.
USPC ........... 361/117; 228/21; 361/127; 428/329

(58) Field of Classification Search ........... 338/21; 361/117, 127; 428/329
See application file for complete search history.

(56) References Cited

U.S. PATENT DOCUMENTS

| | | | | |
|---|---|---|---|---|
| 4,041,436 A | * | 8/1977 | Kouchich et al. | 338/21 |
| 4,046,659 A | * | 9/1977 | Cormia et al. | 204/192.12 |
| 4,726,991 A | * | 2/1988 | Hyatt et al. | 428/329 |
| 5,870,273 A | * | 2/1999 | Sogabe et al. | 361/306.3 |
| 7,570,149 B2 | * | 8/2009 | Kondo | 338/20 |
| 7,664,344 B2 | * | 2/2010 | Sato | 385/2 |
| 2008/0079533 A1 | * | 4/2008 | Liu et al. | 338/21 |

FOREIGN PATENT DOCUMENTS

| | | |
|---|---|---|
| JP | A-2002-15831 | 1/2002 |
| JP | A-2002-538601 | 11/2002 |
| JP | A-2004-6594 | 1/2004 |
| JP | A-2004-14466 | 1/2004 |
| JP | A-2007-37397 | 2/2007 |
| JP | A-2007-48759 | 2/2007 |
| JP | A-2007-265713 | 10/2007 |
| JP | A-2007-317541 | 12/2007 |
| KR | 10-2005-0081942 A | 8/2005 |
| KR | 2005081942 * | 2/2006 |
| KR | A-10-2007-0103870 | 10/2007 |

OTHER PUBLICATIONS

Oct. 17, 2011 Office Action issued in Korean Application No. 2009-0067412 (with English translation).

* cited by examiner

*Primary Examiner* — Rexford Barnie
*Assistant Examiner* — Zeev V Kitov
(74) *Attorney, Agent, or Firm* — Oliff & Berridge, PLC

(57) ABSTRACT

An ESD protection device that has low capacitance, excellent discharge characteristics, and improved heat resistance and weather resistance is provided. A functional layer 31, which is a composite having a conductive inorganic material 33 discretely dispersed in a matrix of an insulating inorganic material 32, is disposed between electrodes 21 and 22 disposed on an insulating substrate 11 and facing but spaced apart from each other.

6 Claims, 7 Drawing Sheets

ESD PROTECTION DEVICE

BACKGROUND OF THE INVENTION

1. Field of the Invention

The present invention relates to an ESD protection device, and particularly to an ESD protection device useful when used in a high-speed transmission system or combined with a common mode filter.

2. Description of the Related Art

Miniaturization and sophistication of electronic apparatus have rapidly been advancing in recent years. Considerable increase in transmission speed (frequency higher than 1 GHz) and decrease in drive voltages have also been achieved, as represented by USB 2.0, S-ATA2, HDMI, and other high-speed transmission systems. In contrast, withstand voltages of electronic components used in electronic apparatus decrease as the electronic apparatus are reduced in size and the drive voltages are reduced in amplitude. An important technical challenge in this case is to protect electronic components from overvoltages represented by electrostatic pulses produced when the human body comes into contact with a terminal of an electronic apparatus.

In related art, to protect electronic components from electrostatic pulses of this type, a multilayer varistor is typically provided between an electrostatically vulnerable line and a ground. However, large capacitance of a multilayer varistor, when used in a high-speed transmission system, causes reduction in signal quality.

A low-capacitance antistatic component that has been proposed has an electrostatic protection material filled between electrodes facing each other. For example, Patent Document 1 discloses an electric circuit protection device (antistatic component) with a voltage variable polymer material placed between electrodes. The electric circuit protection device is formed by applying a conductive particle-containing polymer material into a gap between the electrodes by using stencil printing and solidifying the material in a heat treatment. Patent Document 2 discloses an electrostatic protection material paste obtained by kneading metal particles, each of which has a passive layer formed thereon to enhance a static electricity reduction effect, a silicone-based resin, and an organic solvent. Patent Document 2 also discloses an antistatic component with an electrostatic protection material layer between a pair of electrodes. The antistatic component is formed by applying the electrostatic protection material paste into the space between the electrodes facing each other by using screen printing and drying the resultant structure.

Patent Document 3 discloses a ceramic paste containing a metal oxide, a resin component, and a solvent component. Patent Document 3 also discloses an electric circuit protection device (antistatic component) with a voltage-dependent resistive layer primarily made of zinc oxide formed therein. The electric circuit protection device is formed by burying the ceramic paste between electrode paste films by using screen printing and then sintering the resultant structure at a high temperature.

[Patent Document 1] National Publication of International Patent Application No. 2002-538601

[Patent Document 2] Japanese Patent Laid-Open No. 2007-265713

[Patent Document 3] Japanese Patent Laid-Open No. 2004-006594

However, the antistatic components described in Patent Documents 1 to 3 are characterized in that an organic-inorganic composite film that functions as nonlinear resistance is formed by applying an organic-inorganic composite material containing a resin component and metal particles or a metal oxide and then drying the material. A problem, therefore, is that the thus formed organic-inorganic composite film has poor heat resistance and the characteristics of the film tend to change with temperature, humidity, and other environmental conditions. Further, since the metal particles or the metal oxide undergoes aggregation, segregation, or other phenomena during the preparation process of the organic-inorganic composite material and during the formation process of the organic-inorganic composite film, the overvoltage protection effect of the thus formed film tends to be non-uniform, resulting in poor reliability.

Further, in the antistatic components described in Patent Documents 1 to 3, since the organic-inorganic composite films are formed by using stencil printing, screen printing, or any other suitable method to apply the organic-inorganic composite film materials and drying the resultant structures or treating them in other processes, productivity and cost effectiveness are poor. Moreover, the thickness of the organic-inorganic composite film formed by any of the methods described above is typically at least several tens of micrometers. It is therefore difficult to further reduce the thickness of the organic-inorganic composite film without compromising the productivity and cost effectiveness.

The present invention has been made in view of the above circumstances. An object of the present invention is to provide an ESD protection device that has low capacitance, excellent discharge characteristics, and improved heat resistance and weather resistance. Another object of the present invention is to provide an ESD protection device that has a further reduced thickness and excels in productivity and cost effectiveness.

SUMMARY OF THE INVENTION

The present inventors have conducted intensive studies to achieve the above objects and found that the above objects are achieved by using, as a functional layer disposed between a pair of electrodes, a composite containing a conductive material discretely dispersed in a matrix of an insulating metal oxide. The present invention has been thus attained.

That is, an ESD protection device according to the present invention includes an insulating substrate, electrodes disposed on the insulating substrate and facing but spaced apart from each other, and a functional layer disposed between the electrodes. The functional layer is a composite having a conductive inorganic material discretely dispersed in a matrix of an insulating inorganic material. Since the thus configured ESD protection device functions as a low-voltage discharge-type electrostatic protection material having small capacitance, a low discharge starting voltage, and excellent discharge immunity, the ESD protection device has high performance. Further, since a composite of an insulating inorganic material and a conductive inorganic material is used as the electrostatic protection material unlike the conventional organic-inorganic composite film described above, the heat resistance is greatly enhanced, and the weather resistance to temperature, humidity, and other external conditions is also greatly enhanced.

The word "composite" used herein means a state in which a conductive inorganic material is dispersed in a matrix of an insulating inorganic material, and includes not only a state in which a conductive inorganic material is uniformly or randomly dispersed in a matrix of an insulating inorganic material, but also a state in which clusters of a conductive inorganic material are dispersed in a matrix of an insulating inorganic material, that is, a state typically called a sea-island structure. Further, the word "insulating" used herein means that the resistivity is greater than or equal to 0.1 Ωcm, and the word "conductive" means that the resistivity is smaller than 0.1 Ωcm. What is called "semiconductive" is included in the former word "insulating" as long as the specific resistivity of a material in question is greater than or equal to 0.1 Ωcm.

The thickness of the functional layer preferably ranges from 10 nm to 10 μm, more preferably from 10 nm to 1 μm. When the formed composite has a small thickness ranging from 10 nm to 10 μm as described above, an electronic apparatus using the ESD protection device can be further reduced in size while having high performance. Further, since a composite having an extremely thin thickness ranging from 10 nm to 1 μm can be formed by using a known method for forming a thin film, such as sputtering and deposition, the productivity and cost effectiveness can be enhanced. In other words, unlike an organic-inorganic composite film formed by conventional printing described above, a significant advantage consists in the fact that a composite of an insulating inorganic material and a conductive inorganic material to which a layer formation method, such as sputtering and deposition, can be applied is employed as the functional layer.

The insulating inorganic material is preferably at least one material selected from the group consisting of $Al_2O_3$, $TiO_2$, $SiO_2$, ZnO, $In_2O_3$, NiO, CoO, $SnO_2$, $V_2O_5$, CuO, MgO, $ZrO_2$, AlN, BN, and SiC. Any of these metal oxides, which excel in the insulating property, heat resistance, and weather resistance, effectively functions as a material that forms the insulating matrix of the composite, whereby a high-performance ESD protection device that excels in discharge characteristics, heat resistance, and weather resistance is achieved. Further, these metal oxides are available at low cost and sputtering can be applied to them, productivity and cost effectiveness can also be enhanced.

The conductive inorganic material is preferably at least one metal selected from the group consisting of C, Ni, Cu, Au, Ti, Cr, Ag, Pd, and Pt or any metal compound thereof. Mixing any of the metals or metal compounds with the matrix of the insulating inorganic material in such a way that the metal or metal compound is discretely dispersed therein allows a high-performance ESD protection device that excels in discharge characteristics, heat resistance, and weather resistance to be achieved.

The functional layer is preferably a composite formed by successively or simultaneously sputtering the insulating inorganic material and the conductive inorganic material. In this way, a composite containing a conductive inorganic material discretely dispersed in a matrix of an insulating inorganic material can be obtained readily and reproducibly, whereby the productivity and cost effectiveness can be enhanced.

The present invention not only provides an ESD protection device that has small capacitance, excellent discharge characteristics, and enhanced heat resistance and weather resistance, but also allows the thickness of the ESD protection device to be further reduced as compared to the thickness having been achieved in related art and the productivity and cost effectiveness to be enhanced.

DETAILED DESCRIPTION OF THE EMBODIMENTS

Figure 1:
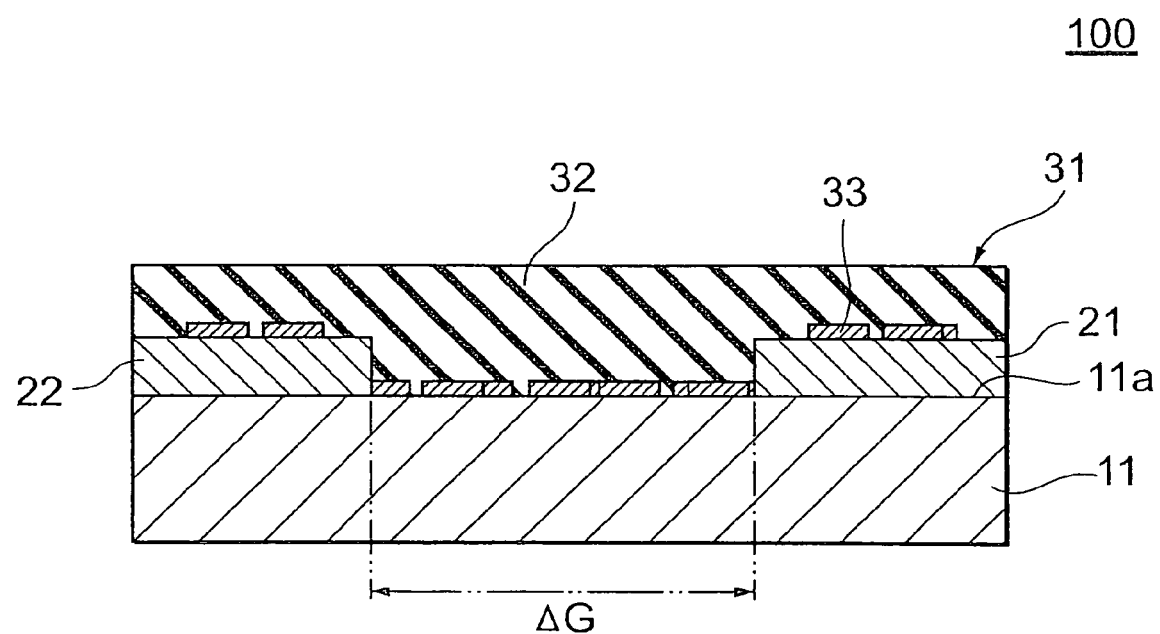
FIG. 1 is a diagrammatic cross-sectional view schematically showing an ESD protection device 100.

Embodiments of the present invention will be described below. The same elements have the same reference characters, and no redundant description thereof will be made. The positional relationship, such as up, down, right, and left, is based on that shown in the drawings unless otherwise stated. Further, the drawings are not sometimes drawn to scale. The following embodiments are presented by way of example to describe the present invention, and the present invention is not limited only to the embodiments.

First Embodiment

FIG. 1 is a diagrammatic cross-sectional view schematically showing a first embodiment of an ESD protection device according to the present invention. An ESD protection device 100 includes an insulating substrate 11, a pair of electrodes 21 and 22 disposed on the insulating substrate 11, a functional layer 31 disposed between the electrodes 21 and 22, and terminal electrodes 41 (see FIG. 6) electrically connected to the electrodes 21 and 22. The ESD protection device 100 is designed to allow the functional layer 31 to function as a low-voltage discharge-type electrostatic protection material and ensure initial discharge between the electrodes 21 and 22 through the functional layer 31 when an overvoltage, such as static electricity, is applied.

The insulating substrate 11 has an insulating surface 11a. The dimensions and shape of the insulating substrate 11 are not particularly limited to any specific ones provided that the substrate can support at least the electrodes 21 and 22 and the functional layer 31. The concept of the insulating substrate 11 having the insulating surface 11a includes not only a substrate made of an insulating material but also a substrate on part or all of which an insulating film is formed.

Specific examples of the insulating substrate 11 may include a ceramic substrate or a single crystal substrate made of a low-dielectric constant material whose dielectric constant is 50 or lower, preferably 20 or lower, such as NiZn ferrite, alumina, silica, magnesia, and aluminum nitride. Other preferred examples may include a ceramic substrate and a single crystal substrate on which an insulating film made of a low-dielectric constant material whose dielectric constant is 50 or lower, preferably 20 or lower, such as NiZn ferrite, alumina, silica, magnesia, and aluminum nitride is formed. A method for forming the insulating film is not particularly limited to a specific one, but any of the following known methods can be used: CVD and PVD, such as vacuum deposition, reactive deposition, sputtering, ion plating, and vapor deposition. The thickness of the substrate and the insulating film can be set as appropriate.

The pair of electrodes 21 and 22 disposed on the insulating surface 11a of the insulating substrate 11 are spaced apart from each other. In the present embodiment, the pair of electrodes 21 and 22 face each other with a distance ΔG of the gap located in a substantially central position of the insulating substrate 11 in a plan view.

The electrodes 21 and 22 are made of, but not limited to, at least one metal selected from, for example, Ni, Cr, Al, Pd, Ti, Cu, Ag, Au, and Pt or any alloy thereof In the present embodiment, the shape of each of the electrodes 21 and 22 is rectangular when viewed from above, but is not limited to a specific shape. For example, each of the electrodes 21 and 22 may have a combtooth or sawtooth shape.

The gap distance ΔG between the electrodes 21 and 22 may be set as appropriate in consideration of desired discharge characteristics and is not limited to a specific value. The gap distance ΔG typically ranges from approximately 0.1 to 50 μm. To ensure low-voltage initial discharge, the gap distance ΔG more preferably ranges from approximately 0.1 to 20 μm, still more preferably approximately 0.1 to 10 μm. The thickness of each of the electrodes 21 and 22 may be set as appropriate and is not limited to a specific value. The thickness typically ranges from approximately 0.05 to 10 μm.

The functional layer 31 is disposed between the electrodes 21 and 22 described above. In the present embodiment, the functional layer 31 is laminated on the insulating surface 11a of the insulating substrate 11 as well as on the electrodes 21 and 22. The dimensions and shape of the functional layer 31 and the position where the functional layer 31 is disposed are not limited to specific ones but can be any dimensions, shape, and position that are designed to ensure initial discharge between the electrodes 21 and 22 through the functional layer 31 when an overvoltage is applied.

Figure 2:
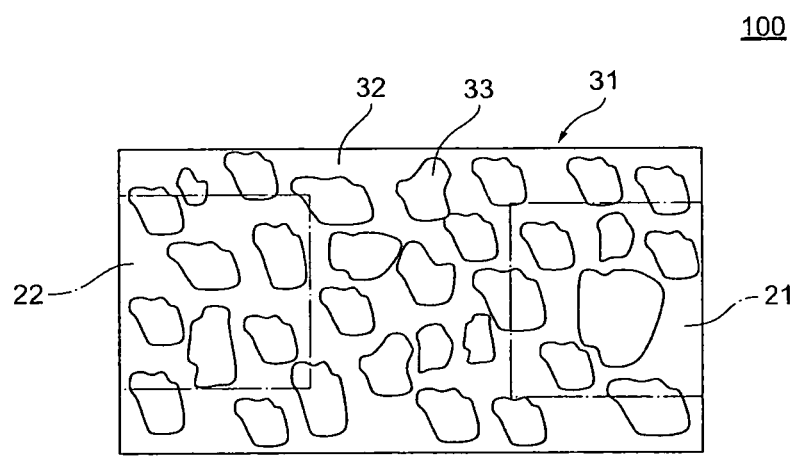
FIG. 2 is a diagrammatic plan view of a functional layer 31 of the ESD protection device 100.

FIG. 2 is a diagrammatic plan view of the functional layer 31 and describes island-shaped conductive inorganic material 33 discretely scattered in a matrix of an insulating inorganic material 32. The functional layer 31 is a composite having a sea-island structure in which clusters of the island-shaped conductive inorganic material 33 are discretely scattered in the matrix of the insulating inorganic material 32. In the present embodiment, the functional layer 31 is formed by successive sputtering. More specifically, a film of the conductive inorganic material 33 is sputtered on parts (but not on the entire surface) of the insulating surface 11a of the insulating substrate 11 and/or on the electrodes 21 and 22, and then the insulating inorganic material 32 is sputtered. As a result, what is called a composite having a laminated structure of a layer of the island-shaped, scattered conductive inorganic material 33 and a layer of the insulating inorganic material 32 that covers the layer of the conductive inorganic material 33 is formed.

Specific examples of the insulating inorganic material 32, which forms the matrix, may include, but not particularly limited to, metal oxides and metal nitrides. Preferred materials are $Al_2O_3$, $TiO_2$, $SiO_2$, ZnO, $In_2O_3$, NiO, CoO, $SnO_2$, $V_2O_5$, CuO, MgO, $ZrO_2$, AlN, BN, and SiC in consideration of the insulating property and cost. Any one of the above materials may be used alone, or two or more thereof may be used in combination. Among them, $Al_2O_3$ and $SiO_2$ are, for example, more preferred when the insulating matrix requires an excellent insulating property. On the other hand, $TiO_2$ and ZnO are more preferred when the insulating matrix requires semiconductivity. An ESD protection device that excels in discharge starting voltage and clamping voltage can be provided by imparting semiconductivity to the insulating matrix. To impart semiconductivity to the insulating matrix, for example, $TiO_2$ or ZnO may be used alone, or $TiO_2$ or ZnO is used in combination with any of the other insulating inorganic material 32. The semiconductivity imparting method is, however, not limited to a specific one. In the case of $TiO_2$, in particular, when sputtered in an argon atmosphere, oxygen is likely deficient and the electric conductivity tends to increase. $TiO_2$ is therefore particularly preferred to impart semiconductivity to the insulating matrix.

Specific examples of the conductive inorganic material 33 may include, but not particularly limited to, metals, alloys, metal oxides, metal nitrides, metal carbides, and metal borides. C, Ni, Cu, Au, Ti, Cr, Ag, Pd, and Pt or alloys thereof are preferred in consideration of the conductivity.

The total thickness of the functional layer 31 is not limited to a specific value and can be set as appropriate. The total thickness preferably ranges from 10 nm to 10 μm, more preferably from 15 nm to 1 μm, still more preferably from 15 to 500 nm, to achieve a further thinner functional layer. When a layer of island-shaped, discretely scattered conductive inorganic material 33 and a layer of the matrix of the insulating inorganic material 32 are formed as in the case of the present embodiment, the thickness of the layer of the conductive inorganic material 33 preferably ranges from 1 to 10 nm, and the thickness of the layer of the insulating inorganic material 32 preferably ranges from 10 nm to 10 μm, more preferably from 10 nm to 1 μm, still more preferably from 10 to 500 nm.

A method for forming the functional layer 31 is not limited to the sputtering described above. The functional layer 31 can be formed by using any known method for forming a thin film to place the insulating inorganic material 32 and the conductive inorganic material 33 described above on the insulating surface 11a of the insulating substrate 11 and/or on the electrodes 21 and 22.

In the ESD protection device 100 of the present embodiment, the functional layer 31 containing the island-shaped conductive inorganic material 33 discretely scattered in the matrix of the insulating inorganic material 32 functions as a low voltage discharge-type electrostatic protection material. Employing the configuration described above allows the ESD protection device 100 to have high performance with small capacitance, low discharge starting voltage, and excellent discharge immunity. Further, since the functional layer 31, which functions as a low voltage discharge-type electrostatic protection material, is the composite made of at least the insulating inorganic material 32 and the conductive inorganic material 33, the heat resistance is enhanced and the characteristics do not tend to change due to temperature, humidity, and other external conditions, as compared to an organic-inorganic composite film of related art described above. As a result, the reliability is enhanced. Moreover, since the functional layer 31 can be formed by sputtering, the productivity and cost effectiveness can be further enhanced. The ESD protection device 100 of the present embodiment may alternatively be formed by applying a voltage between the electrodes 21 and 22 to drift part of the electrodes 21 and 22 into the functional layer 31. In this case, the functional layer 31 contains the material of the electrodes 21 and 22.

Second Embodiment

Figure 3:
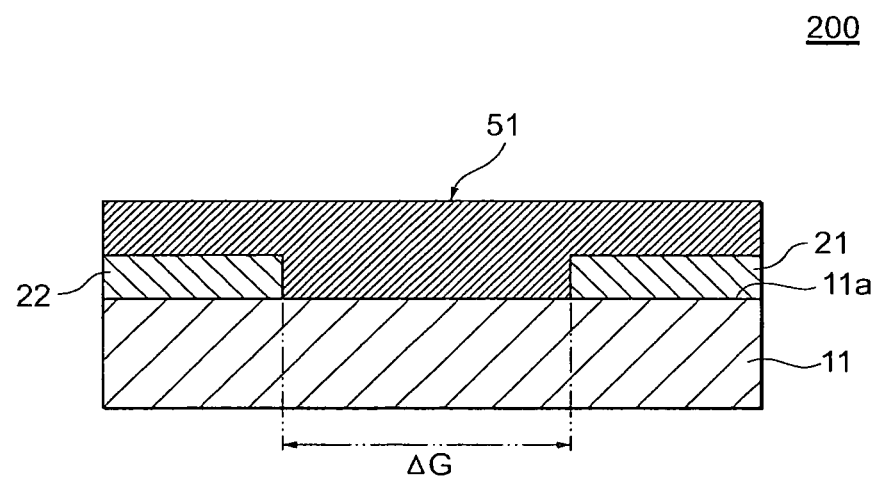
FIG. 3 is a diagrammatic cross-sectional view schematically showing an ESD protection device 200.

FIG. 3 is a diagrammatic cross-sectional view schematically showing a second embodiment of the ESD protection device according to the present invention. An ESD protection device 200 has the same configuration as that of the ESD protection device 100 of the first embodiment described above except that the functional layer 31 is replaced with a functional layer 51.

The functional layer 51 is a composite in which the conductive inorganic material 33 (not shown) is discretely dispersed in the matrix of the insulating inorganic material 32 (not shown). In the present embodiment, the functional layer 51 is formed by sputtering a target containing the insulating inorganic material 32 (or simultaneously sputtering a target containing the insulating inorganic material 32 and a target containing the conductive inorganic material 33) on the insulating surface 11a of the insulating substrate 11 and/or on the electrodes 21 and 22 and then applying a voltage between the electrodes 21 and 22 to randomly drift part thereof into the insulating inorganic material 32. The functional layer 51 of the present embodiment therefore contains at least the material of the electrodes 21 and 22 as the conductive inorganic material 33.

The total thickness of the functional layer 51 is not limited to a specific value and can be set as appropriate. The total thickness preferably ranges from 10 nm to 10 μm, more preferably from 10 nm to 1 μm, still more preferably from 10 to 500 nm, to achieve a further thinner functional layer.

In the ESD protection device 200 of the present embodiment, the composite in which the particulate conductive inorganic material 33 is discretely dispersed in the matrix of the insulating inorganic material 32 is used as the functional layer 51, which functions as a low voltage discharge-type electrostatic protection material. This configuration also provides an advantageous effect similar to that provided in the first embodiment described above.

EXAMPLES

The present invention will be described in detail with reference to examples, but the present invention is not limited thereto.

Example 1

Figure 4:
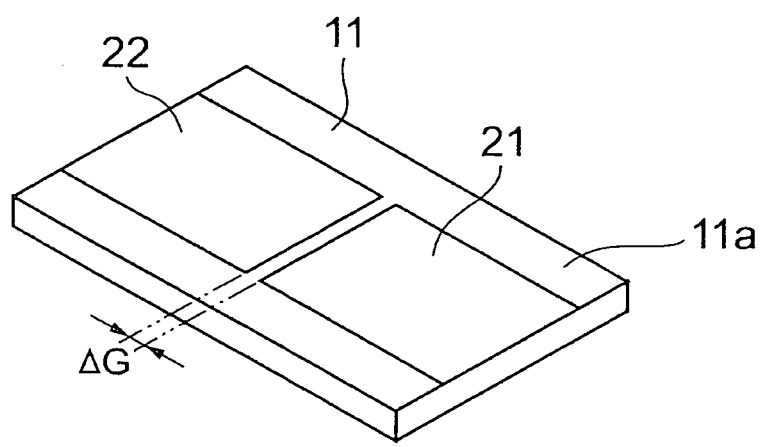
FIG. 4 is a diagrammatic perspective view showing a step of manufacturing the ESD protection device 100.

First, sputtering was used to form a metallic thin film made of Cu and having a thickness of 100 nm nearly all over the insulating surface 11a, which is one surface of the insulating substrate 11 (an NiZn ferrite substrate having a dielectric constant of 13 manufactured by TDK Corporation), as shown in FIG. 4. Photolithography was then used to etch the thus formed Cu thin film so as to form a pair of strip-shaped electrodes 21 and 22 facing but spaced apart from each other. The gap distance ΔG between the electrodes 21 and 22 was 3 μm.

Figure 5:
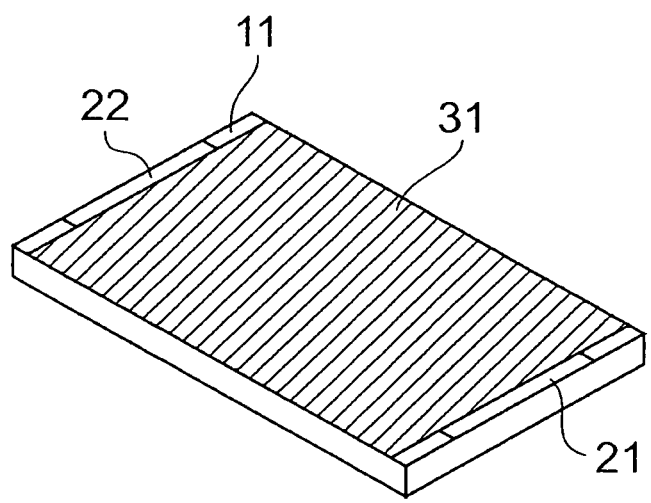
FIG. 5 is a diagrammatic perspective view showing a step of manufacturing the ESD protection device 100.

Thereafter, sputtering was used to form the functional layer 31 on the insulating substrate 11 and on the electrodes 21 and 22 in the following procedure, as shown in FIG. 5:

First, sputtering was used to form an Au film on parts of the surface of the insulating substrate 11 on which the electrodes 21 and 22 were formed. As a result, a layer of the conductive inorganic material 33 in which the island-shaped Au thin films having a thickness of 3 nm were discretely scattered was formed. The sputtering was carried out by using a multi-target sputtering apparatus (Model Name: ES350SU manufactured by EIKO Engineering CO., LTD.) under the conditions of an argon pressure of 10 mTorr, an input electric power of 20 W, and a sputtering period of 40 seconds.

Thereafter, sputtering was used to form a silicon dioxide film nearly all over the surface of the insulating substrate 11 on which the electrodes 21 and 22 were formed in such a way that the silicon dioxide film completely covered the layer of the island-shaped Au thin films and the electrodes 21 and 22 in the thickness direction. A layer of the insulating inorganic material 32 having a thickness of 200 nm was thus formed. The sputtering was carried out by using a multi-target sputtering apparatus (Model Name: ESU350 manufactured by EIKO Engineering CO., LTD.) under the conditions of an argon pressure of 10 mTorr, an input electric power of 400 W, and a sputtering period of 40 minutes.

Figure 6:
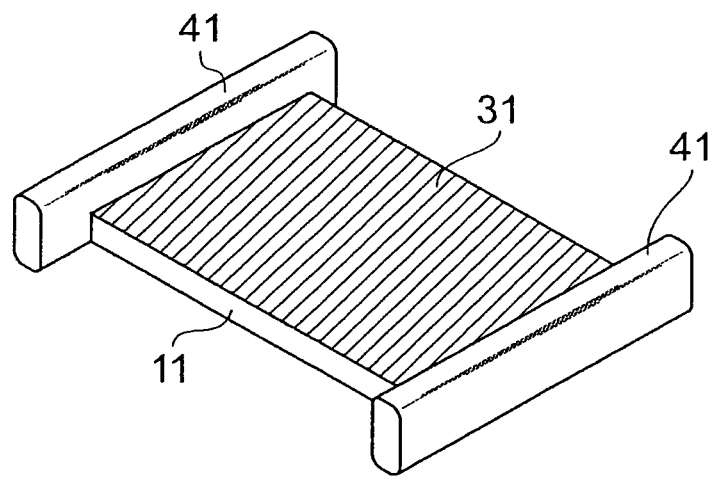
FIG. 6 is a diagrammatic perspective view showing a step of manufacturing the ESD protection device 100.

The functional layer 31 made of the island-shaped conductive inorganic material 33 discretely scattered in the matrix of the insulating inorganic material 32 was formed by carrying out the operations described above. Thereafter, the terminal electrodes 41 primarily made of Cu were formed in such a way that they were connected to the outer ends of the electrodes 21 and 22, as shown in FIG. 6. The ESD protection device 100 of Example 1 was thus obtained.

Example 2

The ESD protection device 100 of Example 2 was obtained by carrying out a procedure similar to that used in Example 1 except that the functional layer 31 having a thickness of 200 nm was formed by using a target made of silicon dioxide and a target made of titanium oxide instead of the target made of silicon dioxide. Before the layer of the insulating inorganic material 32 was formed, the film formation rate versus input electric power was measured for each of the targets. The electric power inputted to each of the targets was adjusted based on the resultant film formation rates, and then the targets were simultaneously sputtered. The adjustment described above allowed the ratio of the silicon dioxide to the titanium oxide to be a predetermined value.

Comparative Example 1

An ESD protection device of Comparative Example 1 was obtained by carrying out a procedure similar to that used in Example 1 except that the functional layer 31 was not formed.

Comparative Example 2

An ESD protection device of Comparative Example 2 was obtained by carrying out a procedure similar to that used in Example 1 except that the sputtering process of the conductive inorganic material 33 was omitted when the functional layer 31 was formed.

Example 3

The ESD protection device 200 of Example 3 was obtained by carrying out a procedure similar to that used in Example 1 except that the functional layer 31 was replaced with the functional layer 51. The functional layer 51 was formed by using a target made of aluminum oxide and a target made of titanium oxide in the following procedure:

Sputtering using the targets made of aluminum oxide and titanium oxide described above was carried out to form a sputtered layer having a thickness of 3 μm nearly all over the surface of the insulating substrate 11 on which the electrodes 21 and 22 were formed in such a way that the sputtered layer completely covered the electrodes 21 and 22 in the thickness direction. The sputtering was carried out by using the multi-target sputtering apparatus (Model Name: ESU350 manufactured by EIKO Engineering CO., LTD.) under the conditions of an argon pressure of 100 mTorr, an input electric power of 9500 W, and a sputtering period of 80 minutes.

Thereafter, the terminal electrodes 41 primarily made of Cu were connected to the outer ends of the electrodes 21 and 22, and then a voltage was applied between the electrodes 21 and 22 five times (applied voltage: 350 V, applied period: 1 nanosecond, interval: 1 second) to drift part of the electrodes 21 and 22 (conductive inorganic material 33) into the sputtered layer. The functional layer 51 in which part of the electrodes 21 and 22 (conductive inorganic material 33) was discretely dispersed in the matrix of the insulating inorganic material 32 made of aluminum oxide and titanium oxide was thus formed. The ESD protection device 200 of Example 3 was thus obtained.

Example 4

The ESD protection device 100 of Example 4 was obtained by carrying out a procedure similar to that used in Example 3 except that each of the electrodes 21 and 22 was formed of a metallic thin film made of Ni and having a thickness of 100 nm instead of the metallic thin film made of Cu.

Examples 5 to 7

The ESD protection devices 100 of Examples 5 to 7 were obtained by carrying out procedures similar to that used in Example 1 except that the gap distance ΔG between the electrodes 21 and 22 was 1 μm and simultaneous sputtering using a target made of silicon dioxide and a target made of titanium oxide was carried out nearly all over the surface to form the functional layer 31 (input electric power: 400 W for silicon dioxide and 250 W for titanium oxide, the amount of doped titanium oxide: as listed in Table 2).

The resistance of the resultant ESD protection devices 100 of Examples 5 to 7 was measured, and any of the resistance values was found to be at least $10^9 \Omega$, which means that each of the resultant ESD protection devices 100 has an adequate insulation property.

<Electrostatic Discharge Test>

Figure 7:
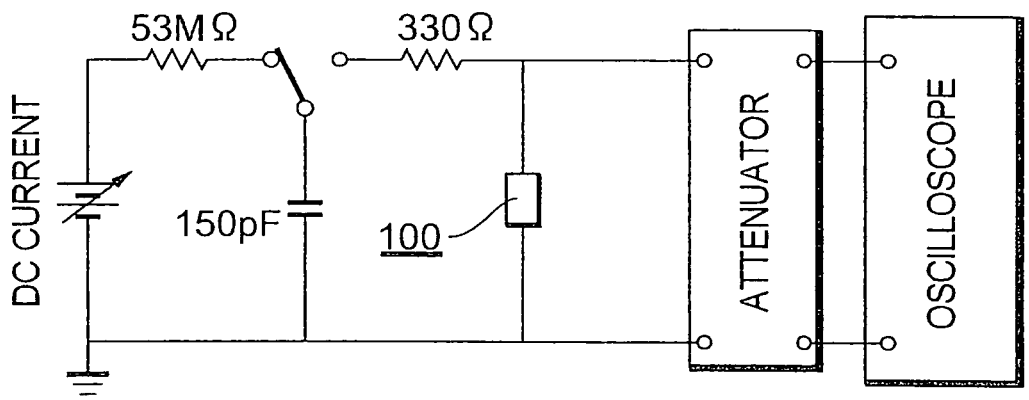
FIG. 7 is a circuit diagram in an electrostatic discharge test.

An electrostatic discharge test was then carried out on the thus obtained ESD protection devices of Examples 1 to 7 and Comparative Examples 1 and 2 by using an electrostatic test circuit shown in FIG. 7.

The electrostatic discharge test was carried out in compliance with the human-body model (discharge resistance: 330Ω, discharge capacitance: 150 pF, applied voltage: 8 kV, contact discharge) based on the electrostatic discharge immunity test and the noise test specified in International Standard IEC 61000-4-2. Specifically, as shown in the electrostatic test circuit in FIG. 7, one of the terminal electrodes of an ESD protection device under evaluation was grounded, and the other terminal electrode was connected to an electrostatic pulse application unit. Thereafter, a discharge gun was brought into contact with the electrostatic pulse application unit to apply electrostatic pulses. The electrostatic pulses applied in the test have a voltage higher than or equal to the discharge starting voltage.

The discharge starting voltage was assumed to be a voltage at which an electrostatic absorption effect appeared in an electrostatic absorption waveform observed when the electrostatic test was carried out by increasing the applied voltage from 0.4 kV in increments of 0.2 kV. A peak voltage was defined as the largest voltage of the electrostatic pulses observed when the electrostatic test based on IEC 61000-4-2 was carried out in the form of contact discharge at a charging voltage of 8 kV. A clamping voltage was defined as the voltage observed after 30 ns from the wavefront value of the electrostatic pulses used in the electrostatic test based on IEC 61000-4-2 carried out in the form of contact discharge at a charging voltage of 8 kV.

The capacitance was defined as capacitance (pF) measured at 1 MHz. The discharge immunity was evaluated by repeating the electrostatic discharge test, measuring the number of repeated electrostatic discharge tests until the ESD protection device under test no longer functioned, and examining how large the number was. Tables 1 and 2 show the evaluation results.

TABLE 1

| | | Example 1 | Example 2 | Comparative Example 1 | Comparative Example 2 | Example 3 | Example 4 |
|---|---|---|---|---|---|---|---|
| | Electrode | Cu | Cu | Cu | Cu | Cu | Ni |
| Functional layer | Insulating inorganic material | $SiO_2$ | $SiO_2 + TiO_2$ | Not applicable | $SiO_2$ | $Al_2O_3 + TiO_2$ | $Al_2O_3 + TiO_2$ |
| | Amount of doped $TiO_2$ (vol %) | — | 30 | — | — | 30 | 30 |
| | Conductive inorganic material | Au | Au | Not applicable | Not applicable | Cu | Ni |
| | Film thickness (μm) | 0.2 | 0.2 | 0 | 0.2 | 3 | 3 |
| Peak voltage (V) | | 800 ○ | 400 ⊚ | 1200 X | 800 ○ | 400 ⊚ | 400 ⊚ |
| Clamping voltage (V) | | 100 ○ | 100 ○ | 30 X | 100 ○ | 100 ○ | 100 ○ |
| Discharge starting voltage (kV) | | 1.6 ○ | 1.2 ⊚ | 2.6 X | 3 X | 1.2 ⊚ | 1.2 ⊚ |
| Capacitance (pF) | | 0.25 ○ | 0.25 ○ | 0.2 ○ | 0.2 ○ | 0.25 ○ | 0.25 ○ |
| Discharge immunity | | 60 times ○ | 60 times ○ | 20 times X | 20 times X | 100 times ⊚ | 100 times ⊚ |

TABLE 2

| | | Example 5 | Example 6 | Example 7 |
|---|---|---|---|---|
| Electrode | | Cu | Cu | Cu |
| Functional layer | Insulating inorganic material | $SiO_2 + TiO_2$ | $SiO_2 + TiO_2$ | $SiO_2 + TiO_2$ |
| | Amount of doped $TiO_2$ (vol %) | 0 | 20 | 40 |
| | Conductive inorganic material | Au | Au | Au |
| | Film thickness (μm) | 0.3 | 0.3 | 0.3 |
| Peak voltage (V) | | 600 ○ | 450 ⊚ | 300 ⊚ |
| Clamping voltage (V) | | 70 ○ | 80 ○ | 120 ○ |
| Discharge starting voltage (kV) | | 1.6 ○ | 1.0 ⊚ | 0.8 ⊚ |
| Capacitance (pF) | | 0.2 ○ | 0.22 ○ | 0.25 ○ |
| Discharge immunity | | 60 times ○ | 100 times ⊚ | 100 times ⊚ |

The results shown in Table 1 indicate that the ESD protection devices of Examples 1 to 4 have not only small capacitance of approximately 0.2 pF at a discharge starting voltage of 2 kV or lower, which means that the ESD protection devices have performance applicable to high-speed transmission systems, but also excellent discharge immunity. In particular, the ESD protection devices of Examples 1 to 4 significantly excel the ESD protection devices of Comparative Examples 1 and 2 in terms of the discharge starting voltage and the discharge immunity.

The results shown in Table 2 indicate that the ESD protection devices of the Examples 5 to 7, each of which employs a functional layer formed of a composite in which a conductive inorganic material is discretely dispersed in a semiconductive matrix, have not only small capacitance of 0.2 pF at a discharge starting voltage of 2 kV or lower, which means that the ESD protection devices have performance applicable to high-speed transmission systems, but also excellent discharge immunity. It is further indicated that the discharge starting voltage decreases as the amount of doped titanium oxide increases.

Examples 8 to 10

Each of the ESD protection devices 100 of Examples 8 to 10 was obtained by carrying out a procedure similar to that used in Example 1 except that sputtering was used to form a layer of the corresponding one of the conductive inorganic materials 33 listed in Table 3, which differ from those used in the above Examples, the layer formed of discretely scattered thin films of the conductive inorganic material, and then a target made of aluminum oxide and a target made of titanium oxide instead of the target made of silicon dioxide were used to form the functional layer 31 having a thickness of 3 μm. Before the layer of the insulating inorganic material 32 was formed, the film formation rate versus input electric power was measured for each of the targets. The electric power inputted to each of the targets was adjusted based on the resultant film formation rates, and then the targets were simultaneously sputtered. The adjustment described above allowed the ratio of the silicon dioxide to the titanium oxide to be a predetermined value. Table 3 shows the evaluation results.

Examples 11 to 13

Each of the ESD protection devices 100 of Examples 11 to 13 was obtained by carrying out a procedure similar to that used in Example 1 except that sputtering was used to form a layer of the corresponding one of the conductive inorganic materials 33 listed in Table 3, which differ from those used in the above Examples, the layer formed of discretely scattered thin films of the conductive inorganic material, and then a target made of aluminum oxide instead of the target made of silicon dioxide was used to form the functional layer 31 having a thickness of 3 μm. Table 3 shows the evaluation results.

TABLE 3

| | | Example 8 | Example 9 | Example 10 | Example 11 | Example 12 | Example 13 |
|---|---|---|---|---|---|---|---|
| | Electrode | Cu | Cu | Cu | Cu | Cu | Cu |
| Functional layer | Insulating inorganic material | $Al_2O_3 + TiO_2$ | $Al_2O_3 + TiO_2$ | $Al_2O_3 + TiO_2$ | $Al_2O_3$ | $Al_2O_3$ | $Al_2O_3$ |
| | Amount of doped $TiO_2$ (vol %) | 30 | 30 | 30 | — | — | — |
| | Conductive inorganic material | C | Cr | Ti | Au | Ag + Pd | Pt |
| | Flim thickness (μm) | 3 | 3 | 3 | 3 | 3 | 3 |
| Peak voltage (V) | | 400 ⊗ | 800 ◯ | 800 ◯ | 400 ⊗ | 400 ⊗ | 400 ⊗ |
| Clamping voltage (V) | | 100 ◯ | 100 ◯ | 100 ◯ | 100 ◯ | 100 ◯ | 100 ◯ |
| Discharge starting voltage (kV) | | 1.2 ⊗ | 1.2 ⊗ | 1.2 ⊗ | 1.6 ◯ | 1.6 ◯ | 1.6 ◯ |
| Capacitance (pF) | | 0.25 ◯ | 0.25 ◯ | 0.25 ◯ | 0.25 ◯ | 0.25 ◯ | 0.25 ◯ |
| Discharge immunity | | 100 times ⊗ | 60 times ◯ | 60 times ◯ | 60 times ◯ | 60 times ◯ | 60 times ◯ |

Examples 14 to 24

Each of the ESD protection devices 100 of Examples 14 to 24 were obtained by carrying out a procedure similar to that used in Example 1 except that the corresponding one of the targets listed in Table 4 instead of the target made of silicon dioxide was used to form the functional layer 31 having a thickness of 3 μm. Table 4 shows the evaluation results.

TABLE 4

|  |  | Example 14 | Example 15 | Example 16 | Example 17 | Example 18 | Example 19 |
|---|---|---|---|---|---|---|---|
|  | Electrode | Cu | Cu | Cu | Cu | Cu | Cu |
| Functional layer | Isulating inorganic material | ZnO | AlN | BN | SiC | $ZrO_2$ | $In_2O_3 + SnO_2$ |
|  | Amount of doped $SnO_2$ (vol %) | — | — | — | — | — | 50 |
|  | Conductive inorganic material | Au | Au | Au | Au | Au | Au |
|  | Film thickness (μm) | 3 | 3 | 3 | 3 | 3 | 3 |
| Peak voltage (V) |  | 400⊗ | 400⊗ | 400⊗ | 400⊗ | 400⊗ | 400⊗ |
| Clamping voltage (V) |  | 100 ○ | 100 ○ | 100 ○ | 100 ○ | 100 ○ | 100 ○ |
| Discharge starting voltage (kV) |  | 1.2⊗ | 1.2⊗ | 1.2⊗ | 1.6 ○ | 1.6 ○ | 1.2⊗ |
| capacitance (pF) |  | 0.25 ○ | 0.25 ○ | 0.25 ○ | 0.25 ○ | 0.25 ○ | 0.25 ○ |
| Discharge immunity |  | 100 times⊗ | 60 times ○ | 60 times ○ | 60 times ○ | 60 times ○ | 60 times ○ |

|  |  | Example 20 | Example 21 | Example 22 | Example 23 | Example 24 |
|---|---|---|---|---|---|---|
|  | Electrode | Cu | Cu | Cu | Cu | Cu |
| Functional layer | Isulating inorganic material | NiO | CoO | CuO | MgO | $V_2O_5$ |
|  | Amount of doped $SnO_2$ (vol %) | — | — | — | — | — |
|  | Conductive inorganic material | Au | Au | Au | Au | Au |
|  | Film thickness (μm) | 3 | 3 | 3 | 3 | 3 |
| Peak voltage (V) |  | 400⊗ | 400⊗ | 400⊗ | 400⊗ | 400⊗ |
| Clamping voltage (V) |  | 100 ○ | 100 ○ | 100 ○ | 100 ○ | 100 ○ |
| Discharge starting voltage (kV) |  | 1.2⊗ | 1.2⊗ | 1.2⊗ | 1.6 ○ | 1.6 ○ |
| capacitance (pF) |  | 0.25 ○ | 0.25 ○ | 0.25 ○ | 0.25 ○ | 0.25 ○ |
| Discharge immunity |  | 60 times ○ | 60 times ○ | 60 times ○ | 60 times ○ | 60 times ○ |

The results shown in Tables 3 and 4 indicate that the ESD protection devices of Examples 8 to 24 have not only small capacitance of approximately 0.2 pF at a discharge starting voltage of 2 kV or lower, which means that the ESD protection devices have performance applicable to high-speed transmission systems, but also excellent discharge immunity.

As described above, any of the ESD protection devices of the present invention has small capacitance, excels in discharge characteristics, has enhanced heat resistance and weather resistance, allows further reduction in thickness, and has enhanced productivity and cost effectiveness. Therefore, any of the ESD protection devices can be broadly and effectively used in electronic/electric devices including the ESD protection device and a variety of apparatus, facilities, and systems including the electronic/electric devices.

What is claimed is:

1. An ESD protection device comprising:
   an insulating substrate;
   electrodes disposed on the insulating substrate and facing but spaced apart from each other; and
   a functional layer disposed between the electrodes, wherein
   the functional layer is a composite consisting of an insulating inorganic material and a conductive inorganic material discretely dispersed in a matrix of the insulating inorganic material, and
   the insulating inorganic material is at least one material selected from the group consisting of $Al_2O_3$, $SiO_2$, ZnO, $In_2O_3$, NiO, CoO, $SnO_2$, CuO, MgO, $ZrO_2$, AlN, and BN.

2. The ESD protection device according to claim 1, wherein the thickness of the functional layer ranges from 10 nm to 10 μm.

3. The ESD protection device according to claim 1, wherein the conductive inorganic material is at least one metal selected from the group consisting of C, Ni, Cu, Au, Ti, Cr, Ag, Pd, and Pt or any metal compound thereof.

4. The ESD protection device according to claim 1, wherein the functional layer is a composite formed by a sputtering process comprising, in the following order:
   a first step of sputtering the conductive inorganic material, and
   a second step of sputtering the insulating inorganic material.

5. The ESD protection device according to claim 1, wherein the functional layer is a composite formed by simultaneously sputtering the insulating inorganic material and the conductive inorganic material.

6. The ESD protection device according to claim 1, wherein the functional layer is uncoated.

* * * * *